(12) United States Patent
Newton et al.

(10) Patent No.: US 7,750,653 B2
(45) Date of Patent: Jul. 6, 2010

(54) AUTOMATED CONTACT ALIGNMENT TOOL

(75) Inventors: David Newton, Tualatin, OR (US); Jon Paulsen, Portland, OR (US); Barry Klinger, Phoenix, AZ (US); Shi Li, Beaverton, OR (US); Spencer Barrett, Beaverton, OR (US); Jasmine Lu, Canby, OR (US); Kent Robinson, Aloha, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 0 days.

(21) Appl. No.: 12/465,089

(22) Filed: May 13, 2009

(65) Prior Publication Data
US 2009/0224789 A1 Sep. 10, 2009

Related U.S. Application Data

(62) Division of application No. 11/838,706, filed on Aug. 14, 2007, now Pat. No. 7,557,594.

(51) Int. Cl.
*G01R 31/02* (2006.01)
(52) U.S. Cl. ...................................... 324/758
(58) Field of Classification Search ................ 324/758, 324/757, 756, 500, 537
See application file for complete search history.

(56) References Cited

U.S. PATENT DOCUMENTS 5,596,283 A 1/1997 Mellitz
5,842,579 A 12/1998 Garcia et al.

*Primary Examiner*—Ha Tran T Nguyen
*Assistant Examiner*—Shaun Campbell
(74) *Attorney, Agent, or Firm*—Young Basile

(57) ABSTRACT

An electronic testing machine that tests electronic components using test contacts is disclosed. A contact takes a plurality of electrical readings for a component retained in a test plate as the test plate is moved in microsteps. These electrical readings can be used to determine alignment and/or to correct alignment as necessary using an adjustment mechanism.

16 Claims, 4 Drawing Sheets

AUTOMATED CONTACT ALIGNMENT TOOL

CROSS-REFERENCE TO RELATED APPLICATION

This application is a divisional of U.S. patent application Ser. No. 11/838,706, filed Aug. 14, 2007.

FIELD OF THE INVENTION

The invention relates to the field of testing equipment for electronic components and more particularly to the field of aligning test contacts.

BACKGROUND

Miniature electronic components are tested in a variety of ways. One group of testing that relates to multiple layer capacitance chips (MLCC) involves electrical testing, including, but not limited to cap testing, cross checking, testing for leakage current, and testing for break down voltage. In the example of U.S. Pat. No. 5,842,579 entitled Electrical Circuit Component Handler, which is incorporated herein by reference, there is shown an example of a rotary style electronic testing machine 10. With reference to FIG. 1 herein, which is a modification of FIG. 2 from U.S. Pat. No. 5,842,579, an electronic component is captured in a test plate 12. A vacuum source passes a vacuum through a base plate to draw electronic components into component pockets on test plate 12.

As illustrated in FIG. 2 herein a stepper motor 16 is operatively connected to test plate 12 to index test plate 12 such that electronic components are delivered to test heads 18 located on testing machine 10. Frequently the test heads are closely spaced. Each test head 18 may include a plurality of test contacts, each test contact configured to conduct the same test. After the testing is complete, test plate 12 continues to index to deliver tested components to blow off zone 22. In blow off zone 22 the electronic components are blown out of the component pocket that contains them and appropriately sorted as a function of the test results. In the example of U.S. Pat. No. 5,842,579 the blow off is accomplished by passing the component pockets over a plurality of blow off holes such that actuation of an air source through a specific blow off hole operates to sort the electronic components according to their individual test results.

Other configurations of test machines are also available. For example, the test plate, rather than being circular in shape may be rectangular. Also drums may be used for certain testing arrangements.

Electronic component testers may be adjusted and/or calibrated such that the individual test contacts properly align over component pockets such that when the test plate 12 is indexed the electronic components are delivered to the contacts so that an acceptable electrical connection is achieved. One way to align the test contacts with the test component pockets is the use of a fixture to assist the placement of test heads. Proper alignment can be more accurately realized by checking the alignment of the test heads with a borescope. In particular, the borescope would be used to visually inspect each contact and its relative positioning against the component pockets on the test plate. This evaluation would include inspection of theta and skew. If a determination was made that the test contact or test head was misaligned, alignment could be achieved by known adjustments.

Because the test heads may be closely spaced, use of borescope may be difficult and time consuming. A need has arisen to improve the process of determining the alignment of the contact heads.

SUMMARY

Other applications of the present invention will become apparent to those skilled in the art when the following description of the best mode contemplated for practicing the invention is read in conjunction with the accompanying drawings.

A method for determining a position of a plurality of test contacts on an electronic component testing machine is disclosed. The component testing machine includes a component test plate configured to retain a plurality of electronic components. The test plate is movable between a plurality of index positions such that electronic components electrically connect to the testing contacts at each index position. The electrical connectivity between an electronic component and a testing contact is measured at a plurality of microsteps where each the microstep is a fraction of an index. A plurality of electrical measurements is provided for an individual test contact. The plurality of measurements is evaluated to determine the alignment of the test contact.

A method for aligning at least one of a plurality of test contacts on an electronic component testing machine is also provided. The component testing machine includes a test plate configured to retain a plurality of electronic components and the test plate is movable between a plurality of index positions. Electronic components electrically connect to the plurality of testing contacts at each index. The method includes measuring the electrical connectivity between the electronic component and a testing contact at a plurality of microsteps and a plurality of electrical measurements is provided for a single test contact. The test contact is adjusted based on the plurality of electrical measurements.

An electronic component testing machine is also provided. The machine includes a test plate configured to retain a plurality of electronic components and includes a plurality of test heads. Each test head has a plurality of test contacts. The test plate is operatively connected to a drive mechanism such that the test plate is movable between a plurality of index positions to deliver a plurality of electronic components to one of the test heads. A motion controller is configured to move the test plate in microsteps where the microsteps are a distance less than an index. A controller is configured to take multiple electrical measurements between an electronic component and an individual test contact for each microstep resulting in a plurality of electrical measurements. Means are provided to adjusting the test contact to bring it into alignment based on the electrical measurements

BRIEF DESCRIPTION OF THE DRAWINGS

The description herein makes reference to the accompanying drawings wherein like reference numerals refer to like parts throughout the several views, and wherein.

DETAILED DESCRIPTION

In normal operation of an electronic test machine a test plate will index from test head to test head. At each test head an electrical measurement will be made. It has been discovered that by dividing the index into a plurality of microsteps an electronic component can be swept underneath a test contact to evaluate the location of a test contact. In one example, the location of the electronic component may be measured relative to a fixed position on the test machine. This fixed position may be at least one blow off hole positioned on a base plate of the test machine. Other fixed locations may be utilized as well. The fixed position may be correlated against the position of a motor driving the test plate to provide a centerline. In the case of a test plate that includes electronic components drawn into component pockets by a vacuum, this fixed position on the machine could possibly become offset relative to the test plate as the test plate becomes loaded with components. In such a case, both a loaded and an unloaded centerline may be provided. For each microstep a determination may be made whether an electrical connection exists between the electronic component and the test contact. Based on the positioning of the plurality of electrical measurements relative to either centerline conclusions may be drawn with respect to alignment. The data derived from the measurements may be graphically presented to a user such that the user can draw conclusions with regard to alignment, or the system may evaluate the data and inform the user whether adjustments are necessary and if so what those adjustments are.

Figure 1:
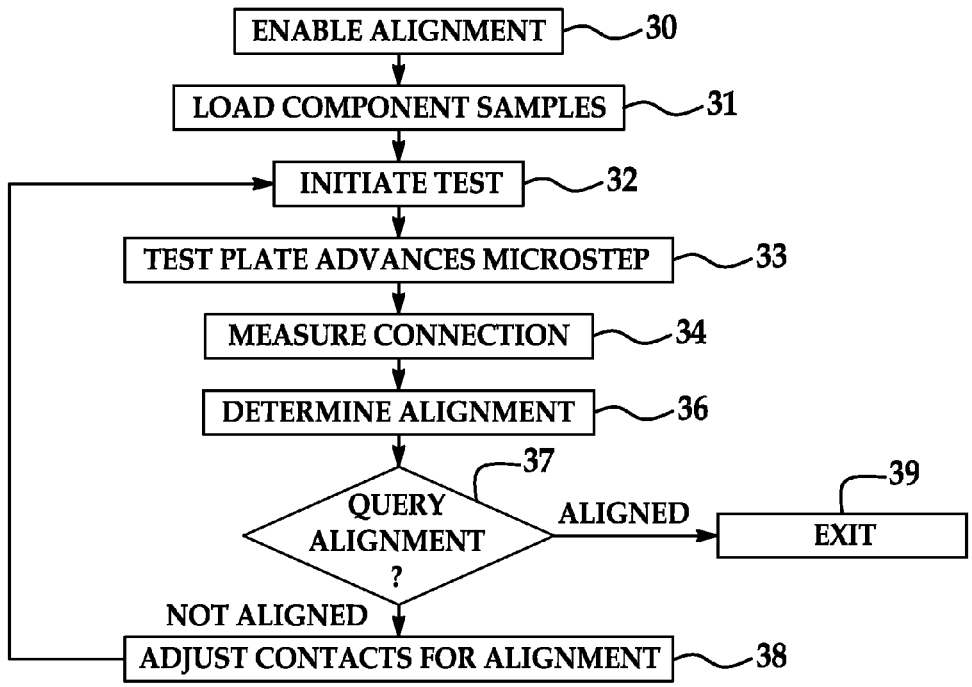
FIG. 1 is a flow chart depicting the process of determining the alignment of test contacts and including an adjustment of the test contacts.

With reference to FIG. 1 there is shown a flow chart illustrating the acts of the method of the present invention. With reference to act 31 a test mode is enabled. At act 31 sample components are loaded into test plate 12. At the test act 31 a motion controller 17 divides each index into a plurality of microsteps. These microsteps may be defined by motor steps of a stepper motor and may be of an arbitrary distance. In one example where the test plate includes eight concentric rings of 200 holes, an index may be approximately 1.8 degrees. In this example, the index of 1.8 degrees may be divided into 200 microsteps, thus enabling the test plate to advance 0.009 degrees for each microstep. As a rule of thumb it has been discovered that dividing the microsteps into a distance approximating 1/20 of the width of the component being tested provides useful results. However, the microstep may be a larger or smaller fraction of the index size.

At act 33 the test plate is advanced by the above described microstep amounts. At act 34 the alignment system attempts to measure the electronic connection between a test contact 20 and the electronic component for each microstep. In one example the measurement is merely binary, meaning the system determines, yes or no, whether a connection has been made. In act 36 the alignment of the test contact is determined. The alignment may be determined either automatically or with reference to a graphic representation of data.

Figure 2:
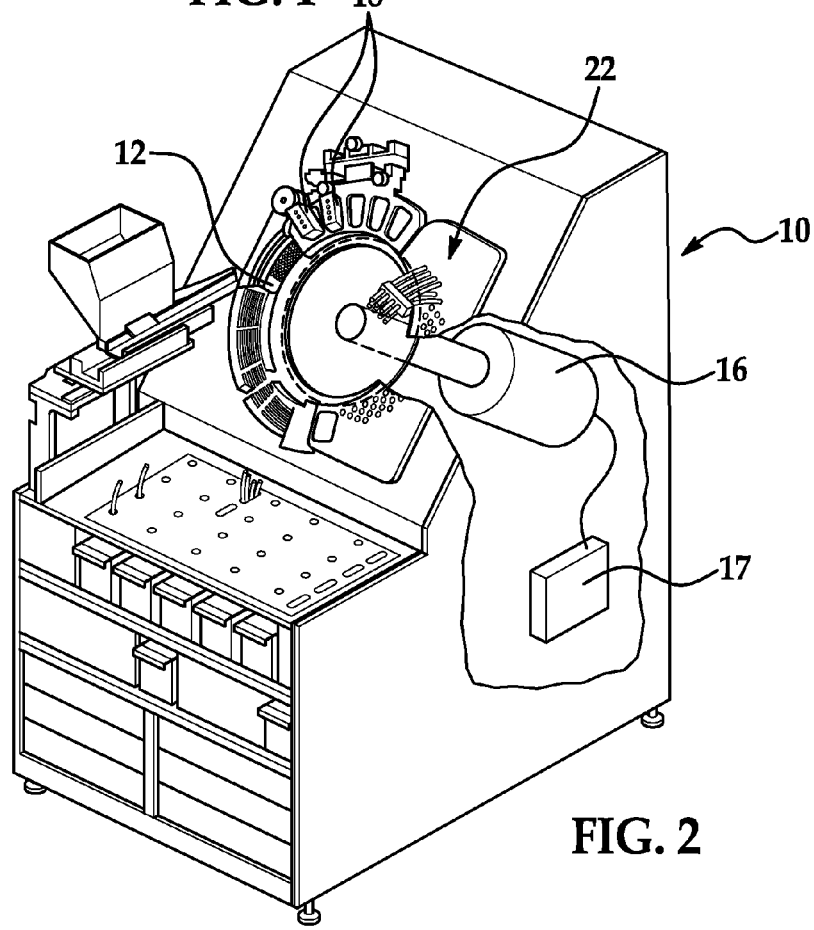
FIG. 2 is a simplified perspective view of an electrical testing machine modified according to one embodiment of the invention.
Figure 2A:
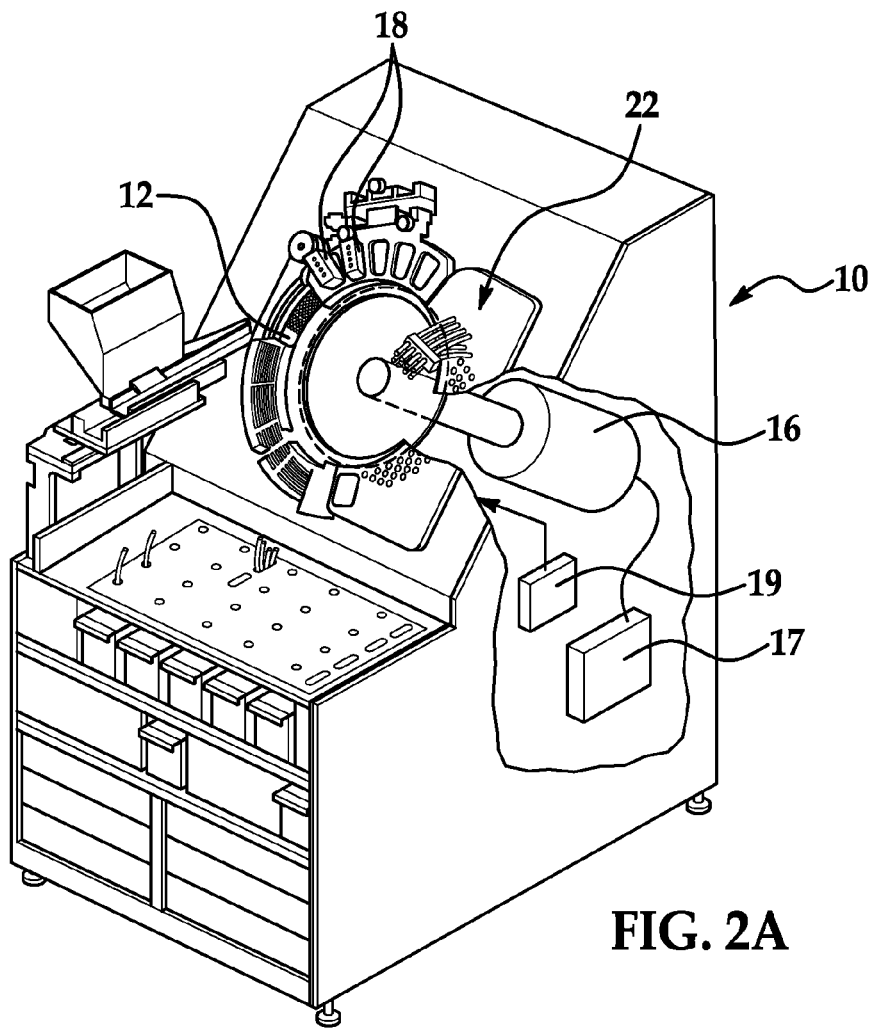
FIG. 2A is a simplified perspective view of a testing machine configured to carry out the process of FIG. 1.
Figure 4:
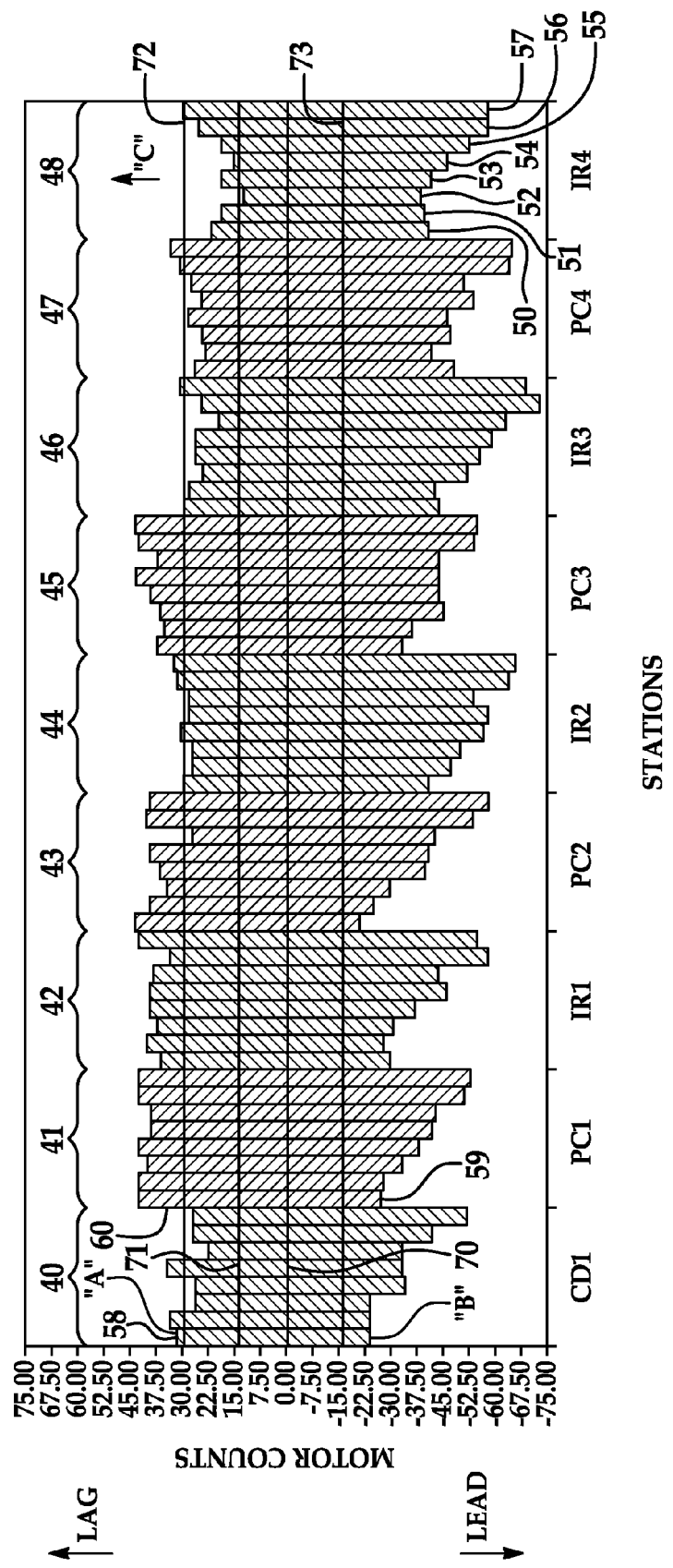
FIG. 4 illustrates an optionally graphical output depicting the relative alignment of a plurality of test contacts on a plurality of test heads.

With reference to FIG. 2 A test machine 10 further includes controller 19 configured to receive the data from act 34 and either graphically presents it, as in FIG. 4, or makes other calculations. Controller 19 may be part of an overall controller for machine 10 or may be a separate controller.

With reference to FIG. 4 there is shown a graphical representation of the output of a microstep evaluation of the alignment of the plurality test contacts. In the illustrative example of FIG. 4 there is shown the evaluation of nine different contact heads, 40, 41, 42, 43, 44, 45, 46, 47, and 48. Each contact head includes a plurality of contacts, e.g. 50, 51, 52, 53, 54, 55, 56, and 57 which have each been individually evaluated. Another example of an evaluation an individual head is seen at 58. The vertical bar referenced as 58 represents a plurality of successful microstep connections between points A and B.

Individual contacts may be evaluated to determine whether the connection between the test contact and the electronic component is consistent. With reference to head 59 there is shown a collection of microstep connections where for a portion of the microsteps e.g. 60 where no electrical connection could be made between the test contacts and the electronic component. This illustration would inform the operator that there was intermittent contact between the test contact at 59 and its associated component. An operator may remedy this in a variety of ways including replacement of the test contact at 59.

FIG. 4 further illustrates an unloaded nominal center indicator line 70. Unloaded nominal center indicator line 70 references the positional centerline of the component pocket when the test plate is moving and unloaded. The measurement is made from a fixed position on the machine when the test plate is unloaded and moving.

Figure 3:
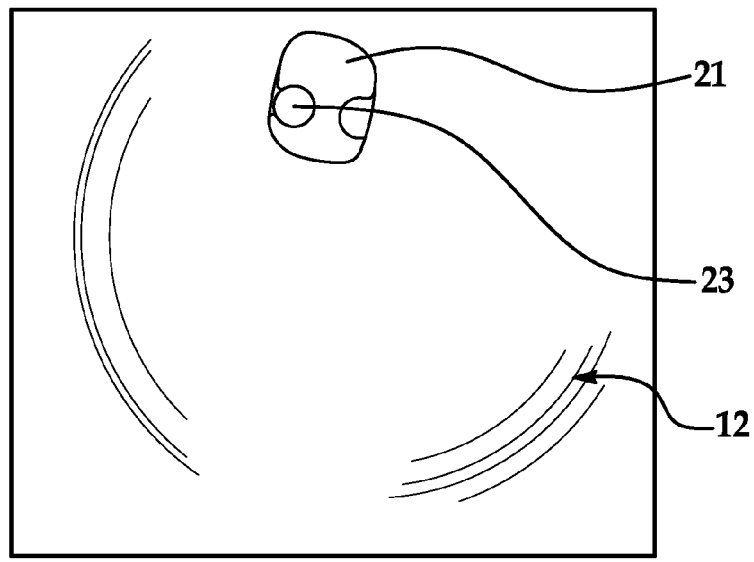
FIG. 3 is a close up plan view of a test pocket positioned over a pair of blow off holes.

One example of determining a centerline is shown in FIG. 3. In particular when the test plate is moving a pair of blow off holes 23 may be observed and positionally correlated against a motor count location. In the example of FIG. 4 the number of motor counts per angle of rotation of the test plate may be determined. The component pockets 21 center themselves over the blow off holes 23 at a repeatable motor count. In the example of FIG. 4 this repeatable motor count is arbitrarily set at a zero motor count when the test plate is rotating and empty, as noted by reference numeral 70. It has been observed that in operation of certain electronic component testing machines, such as the model 3430 as sold by Electro Scientific Industries, Inc., the assignee of the instant application, a dynamic shift offset from the centerline occurs as the test plate is loaded with electronic components. That is, the rows of component pockets center themselves over the blow off holes 23 at a slightly different motor count when loaded. One cause of this dynamic shift is the vacuum utilized to retain the electronic component pockets. In the example of FIG. 4 the dynamic shift was measured as approximately 15 positive motor counts. Thus, in some examples a dynamic centerline 71 may be provided. An upper connect limit 72 and a lower contact limit line 73 may also be provided. In the example of FIG. 4 the upper contact and lower contact limit lines provide suggestive limits where the test components within which component pockets 21 should be found. In the example of FIG. 4 a connection between the electronic component and the test contacts is expected to occur between a positive 30 motor counts to a minus 15 motor counts.

With reference again to FIG. 1, act 37 queries as to whether the test heads are aligned. If the test heads are not aligned, the test heads may be aligned at act 38. Act 38 involves adjusting the test contacts and/or test head such that they would be properly aligned with the test component received in the component pocket 21 in the test plate 12. With reference to the example of FIG. 4 one way to make this adjustment would be as follows. Looking to the microstep measurements taken at 48 it can be seen that the measurements are biased in a leading direction. At least some of the microstep measurements in the example did not achieve a connection at the dynamic centerline 71. Thus an adjustment may be made to shift the test head in the direction of arrow "C".

Figure 5:
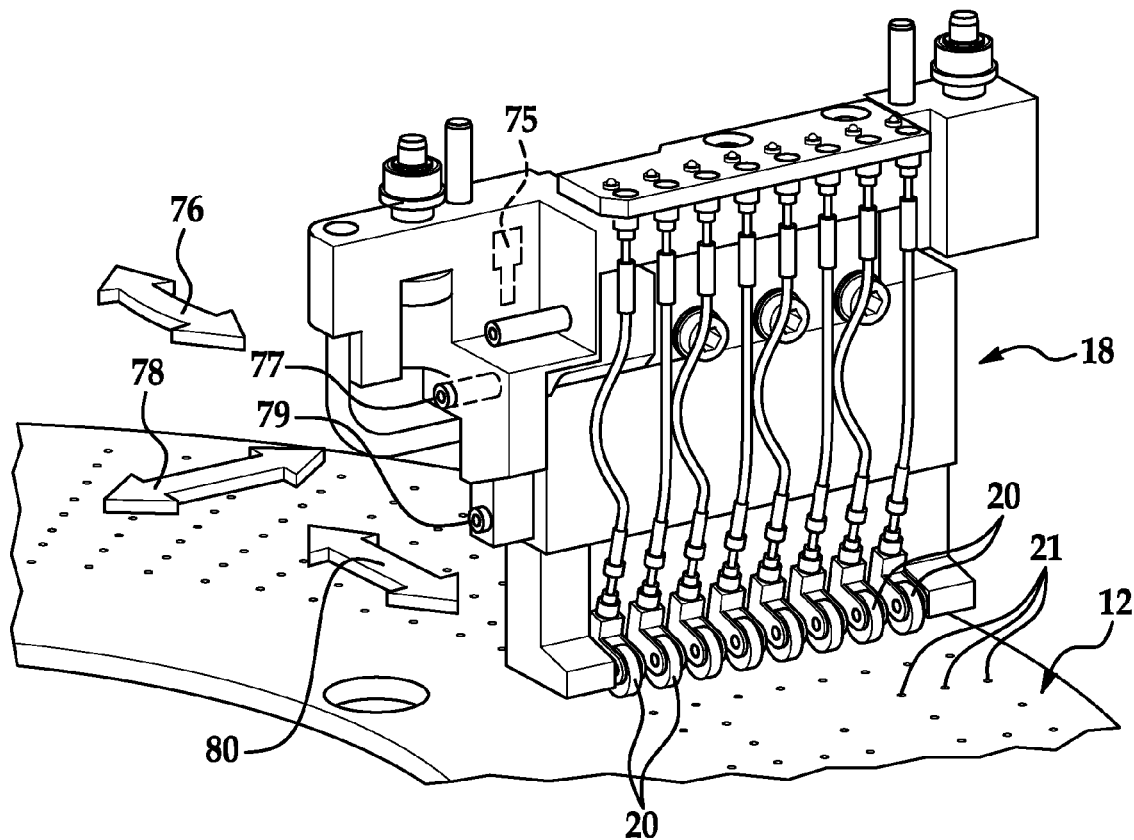
FIG. 5 is a representative example of an adjustment mechanism that will adjust positioning of a test head.

With reference to FIG. 5 there is shown a simplified test head 18 including a plurality of test contacts 20. Test head 18 is illustrated with reference to a test plate 12 and component pockets 21. As is illustrated in FIG. 5 test head 18 may include adjustments for y skew 75, a y adjustment 77 and a theta adjustment 79. Movement of the aforementioned adjustments in the example of FIG. 5 will move test head 18 in the y skew direction 76, the y direction 78 and the theta direction 80.

In the context of measuring connections at act 34 of FIG. 1, the resulting data may inform a user of adjustments to a test head 18 to improve the alignment of the test head relative to the connect pockets. In the example of FIG. 4 alignment information is graphically displayed to a user who may then interpret the data and adjust the test head. In an alternate example the measurement data may be mathematically interpreted and a user may be specifically informed of the adjustment to bring the test head into alignment. For example, this adjustment may inform the user to turn the theta adjustment one turn clockwise.

As shown with respect to head 48 in FIG. 4 the measurement results are preferably in a tapered pattern. This tapered pattern is a function of test plate 12 being circular. It is understood that a non-circular test plate may not yield a tapered pattern of measurement results. The y skew adjustment 75 affects the taper of the measurements.

Figure 6:
FIG. 6 is a simplistic illustration of different pattern profiles of microstep contact measurements for a test head.
Figure 6:
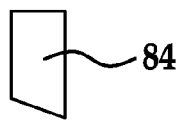
Figure 6:
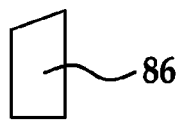

With reference to FIG. 6 there are shown example profile patterns where the taper is skewed and y skew adjustment may be advisable. In the example 82 the y skew is correct for a circular test plate. In the example of 84 y skew is clockwise oriented and needs to be adjusted counter clockwise. In the example of 86 y skew is counter clockwise oriented and needs to be adjusted clockwise.

With reference again to the example of FIG. 1, after an adjustment has been made, act 32 may be reinitiated to confirm alignment. Reinitiating act 32 may not be necessary and may depend on customer preferences. If the query at act 37 indicates alignment, either determined automatically or by reference to a graphic illustration, the process is complete at act 39.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An electronic component testing machine, the machine including a test plate configured to retain a plurality of electronic components; the machine further including a plurality of test contacts and the test plate operatively connected to a motor such that the test plate is movable between a plurality of index positions such that each test contact comes into contact with a distinct electronic component to perform a discrete electrical test, the improvement comprising:
   a motor controller configured to move the test plate in microsteps, the microsteps being a distance less than an index;
   a controller configured to take multiple electrical measurements between an electronic component and a test contact for each microstep such that a plurality of electrical measurements is made between the test contact and at least one electronic component; and
   means for adjusting the test contact to bring it into alignment based on the plurality of electrical measurements.

2. The electronic component testing machine as in claim 1 wherein the adjusting means comprises an adjustment screw configured to adjust a test head associated with the test contact.

3. The electronic component testing machine as in claim 1 wherein the adjusting means comprises an adjustment screw configured to adjust the test contact.

4. The electronic component testing machine as in claim 2 wherein the adjustment screw is configured to adjust the test contact in a theta orientation.

5. The electronic component testing machine as in claim 1 wherein the motor is a stepper motor.

6. The electronic component testing machine as in claim 1 wherein the controller is further configured to evaluate the plurality of electrical measurements to determine the alignment of the test contact.

7. The electronic component testing machine as in claim 1 wherein the adjusting means adjusts the test contact relative to a centerline, the centerline being a function of a fixed position on the test machine.

8. An electronic component testing machine, the machine including a test plate configured to retain a plurality of electronic components; the machine further including a plurality of test contacts and the test plate operatively connected to a motor such that the test plate is movable between a plurality of index positions such that each test contact comes into contact with a distinct electronic component to perform a discrete electrical test, the improvement comprising:
   a motor controller configured to move the test plate in microsteps, the microsteps being a distance less than an index; and
   a controller configured to take multiple electrical measurements between an electronic component and a test contact for each microstep such that a plurality of electrical measurements is made between the test contact and at least one electronic component and the controller configured to evaluate the plurality of electrical measurements to determine an alignment of the test contact.

9. The electronic component testing machine as in claim 8, further comprising:
   an adjustable connection supporting the test contact for adjustably bringing a misaligned test contact into alignment based on an evaluation of the plurality of electrical measurements.

10. The electronic component testing machine as in claim 8 wherein the alignment of the test contact is whether an intermittent contact condition exists.

11. The electronic component testing machine as in claim 8 wherein the controller is configured to evaluate the plurality of electrical measurements by comparing measurements for a single contact against a centerline to determine whether the alignment is leading or lagging.

12. The electronic component testing machine as in claim 11 wherein the centerline is between a pair of blow off holes located on the electronic testing machine.

13. The electronic component testing machine as in claim 11 wherein the centerline is a dynamic centerline.

14. The electronic component testing machine as in claim 8 wherein each index comprises about 200 microsteps.

15. The electronic component testing machine as in claim 8 wherein each test contact is part of a test head, the test head including a plurality of test contacts.

16. The electronic component testing machine as in claim 8 wherein the test head includes a theta adjustment and a y skew adjustment.

* * * * *